United States Patent
Piret et al.

(10) Patent No.: US 7,461,329 B2
(45) Date of Patent: Dec. 2, 2008

(54) CHANNEL ENCODING ADAPTED TO ERROR BURSTS

(75) Inventors: Philippe Piret, Cesson-Sevigne (FR); Frédéric Lehobey, Rennes (FR); Philippe Le Bars, Thorigne-Fouillard (FR)

(73) Assignee: Canon Kabushiki Kaisha, Tokyo (JP)

( * ) Notice: Subject to any disclaimer, the term of this patent is extended or adjusted under 35 U.S.C. 154(b) by 496 days.

(21) Appl. No.: 11/085,129

(22) Filed: Mar. 22, 2005

(65) Prior Publication Data
US 2005/0210357 A1 Sep. 22, 2005

(30) Foreign Application Priority Data
Mar. 22, 2004 (FR) .................... 04 02916

(51) Int. Cl.
G06F 11/00 (2006.01)
G08C 25/00 (2006.01)
(52) U.S. Cl. ...................... 714/799; 714/780
(58) Field of Classification Search ................ 714/799, 714/780
See application file for complete search history.

(56) References Cited

U.S. PATENT DOCUMENTS

| | | | | |
|---|---|---|---|---|
| 5,905,739 | A | 5/1999 | Piret et al. ............... 371/37.01 |
| 6,307,487 | B1 * | 10/2001 | Luby ........................... 341/50 |
| 6,543,021 | B1 | 4/2003 | Piret ........................... 714/752 |
| 6,567,465 | B2 * | 5/2003 | Goldstein et al. ........... 375/222 |
| 6,578,170 | B1 | 6/2003 | Piret et al. .................. 714/758 |
| 6,578,171 | B1 | 6/2003 | Braneci et al. ............. 714/786 |
| 6,614,366 | B2 * | 9/2003 | Luby ........................... 341/50 |
| 6,638,318 | B1 | 10/2003 | Piret et al. .................. 718/781 |
| 6,757,122 | B1 * | 6/2004 | Kuznetsov et al. ........... 360/53 |
| 6,766,489 | B1 | 7/2004 | Piret et al. .................. 714/755 |
| 6,789,227 | B2 * | 9/2004 | De Souza et al. ........... 714/804 |
| 6,910,006 | B2 | 6/2005 | Piret ........................... 704/203 |
| 6,993,698 | B2 | 1/2006 | Piret ........................... 714/755 |
| 7,069,492 | B2 | 6/2006 | Piret ........................... 714/762 |
| 2004/0117709 | A1 | 6/2004 | Lehobey et al. ............. 714/781 |

(Continued)

FOREIGN PATENT DOCUMENTS
EP 1 434 132 A1 6/2004

(Continued)

OTHER PUBLICATIONS

"On the Decoding of Algebraic-Geometric Codes", T. Hoeholdt et al., IEEE Transactions On Information Theory, IEEE Inc. N.Y., USA, vol. 41, No. 6, Nov. 1995, pp. 1589-1614, XP002224191, ISSN: 0018-9448.

(Continued)

*Primary Examiner*—M. Mujtaba K Chaudry
(74) *Attorney, Agent, or Firm*—Fitzpatrick, Cella, Harper & Scinto (57) ABSTRACT

A method of encoding information symbols comprises a step in which a word $\underline{v}$, orthogonal to a matrix H, the element $H_{\alpha\beta}$ of which is equal to the value taken by some monomial $h^\alpha = Y^j X^i$ at the point $P_\beta$ of some locating set, is associated with every block of k information symbols belonging to a Galois field $F_q$. The method chooses the set of monomials $h_\alpha$ so as to define codes which can be decoded with an algorithm by aggregates of low complexity, and which provides a very good error correction capability, in particular for channels in which the errors tend to occur in bursts. Devices and apparatuses adapted to implement this method are also disclosed.

4 Claims, 3 Drawing Sheets

U.S. PATENT DOCUMENTS

2004/0194006 A1    9/2004  Piret et al. .................. 714/800

OTHER PUBLICATIONS

"On the Decoding of Algebraic-Geometric Codes", Alexei N. Skorobogatov et al., IEEE Transactions On Information Theory, IEEE Inc. N.Y., USA, vol. 36, No. 5, Sep. 1, 1990, pp. 1051-1060, XP000141830, ISSN 0018-9448.

"Generalized Berlekamp-Massey Decoding of Algebraic-Geometric Codes up to Half the Feng-Rao Bound", Shojiro Sakata et al., IEEE Transactions on Information Theory, IEEE Inc. N.Y., USA, vol. 41, No. 6, Nov. 1995, pp. 1762-1768.

"A Generalization of the Berlekamp-Massey-Sakata Algorithm", M.E. O'Sullivan, Online—http//www-rohan.sdsu.edu/ mosullv/Papers/bmsalg6.ps.gz, Jun. 15, 2001, pp. 1-25 XP002300271.

"A Generalized Forney Formula For Algeraic-Geometric Codes", D. A. Leonard, IEEE Transactions On Information Theory, IEEE Inc. N.Y., USA, vol. 42, No. 4, Jul. 1996, pp. 1263-1268, XP000956925, ISSN 0018-9448.

"A Key Equation And The Computation of Error Values For Codes From Order Domains", John B. Little, Apr. 7, 2003, pp. 1-25, XP002300272, http//www.arXiv.org/abs/math.AC/03032 99.

"Introduction to Coding Theory", J.H. Van Lint, $3^{rd}$ Ed. 1999, Springer Verlag, XP002300273, pp. 148-165.

"Handbook of Coding Theory", V.S. Pless et al., Elsevier Science, 1998. XP002300927, pp. 871-961.

T. Hoholdt et al., Handbook of Coding Theory, Chapter 10: "Algebraic Geometry Codes", pp. 871-961, 1998.

Fan, et al. "A Modified Concatenated Coding Scheme, with Applications to Magnetic Storage", 11 pages, IEEE Transactions on Information Theory, col. 44, pp. 1656-1674, Jul. 1998.

Saeki et al., "Optimal Combination of Detection of Detection and Error Correction Coding for Magnetic Recording", IEEE Transactions on Magnetics, vol. 37, No. 2, Mar. 2001.

H. Stichtenoth, "Algebraic Function Fields and Codes", Foundations of the Theory of Algebraic Function Fields, Chapter 1, Springer-Verlag, US, pp. 1-29, 1993.

R.E. Blahut, "Theory and Practice of Error Control Codes", Addison Wesley, US, XP002272858, pp. 94-96, Chapter 5.1: "Viewing a Code from an Extension Field", 1984.

R.E. Blahut, "Theory and Practice of Error Control Codes", Addison Wesley, US, XP002272857 pp. 119-123, Chapter 5.8: "The Binary Golay Code", 1983.

* cited by examiner

CHANNEL ENCODING ADAPTED TO ERROR BURSTS

This application claims priority of French patent application No. 0492916 filed on Mar. 22, 2004, which is incorporated herein by reference.

FIELD OF THE INVENTION

The present invention concerns systems for communication or recording of data in which the data are subjected to a channel encoding in order to improve the fidelity of the transmission or storage. It concerns more particularly an encoding method as well as the devices and apparatuses adapted to implement this method.

BACKGROUND OF THE INVENTION

It will be recalled that channel "block encoding" consists, when the "codewords" sent to a receiver or recorded on a data carrier are formed, of introducing a certain level of redundancy in the data. More particularly, by means of each codeword, the information is transmitted that is initially contained in a predetermined number k of symbols taken from an "alphabet" of finite size q; on the basis of these k information symbols, calculation is made of a number n>k of symbols belonging to that alphabet, which constitute the components of the codewords: $\underline{v}=(v_1, v_2, \ldots, v_n)$. The set of codewords obtained when each information symbol takes some value in the alphabet constitutes a sort of dictionary referred to as a "code" of "dimension" k and "length" n.

When the size q of the alphabet is a power of a prime number, the alphabet can be given a field structure known as a "Galois field" denoted $F_q$, of which the non-zero elements may conveniently be identified as each being equal to $\gamma_i$ for a corresponding value of i, where $i=1, \ldots, q-1$, and where $\gamma$ is a primitive $(q-1)^{th}$ root of unity in $F_q$.

In particular, certain codes, termed "linear codes" are such that any linear combination of codewords (with the coefficients taken from the alphabet) is still a codeword. These codes may conveniently be associated with a matrix H of dimension $(n-k) \times n$, termed "parity-check matrix": a word $\underline{v}$ of given length n is a codeword if, and only if, it satisfies the relationship: $H \cdot \underline{v}^T = 0$ (where the exponent T indicates the transposition); the code is then said to be "orthogonal" to the matrix H.

At the receiver, the associated decoding method then judiciously uses this redundancy to detect any transmission errors and if possible to correct them. There is a transmission error if the difference $\underline{e}$ between a received word $\underline{r}$ and the corresponding codeword $\underline{v}$ sent by the transmitter is non-zero.

More particularly, the decoding is carried out in two main steps.

The first step consists of associating an "associated codeword" with the received word. To do this, the decoder first of all calculates the "error syndromes vector" $\underline{s} = H \cdot \underline{r}^T = H \cdot \underline{e}^T$ of length (n-k) (in the context of the present invention, no difference is made between the term "word" and the term "vector"). If the syndromes are all zero, it is assumed that no transmission error has occurred, and the "associated codeword" will then simply be taken to be equal to the received word. If that is not the case, it is thereby deduced that the received word is erroneous, and calculations are then performed that are adapted to estimate the value of the error $\underline{e}$; in other words, these calculations provide an estimated value $\hat{\underline{e}}$ such that $(\underline{r} - \hat{\underline{e}})$ is a codeword, which will then constitute the "associated codeword". Usually, this first step of the decoding is divided into two distinct sub-steps: a first so-called "error locating" sub-step, during which the components of the received word are determined of which the value is erroneous, and a second so-called "error correction" sub-step, during which an estimation is calculated of the transmission error affecting those components.

The second step simply consists in reversing the encoding method. In the ideal situation in which all the transmission errors have been corrected, the initial information symbols are thereby recovered.

It will be noted that in the context of the present invention, reference will often be made to "decoding" for brevity, to designate solely the first of those steps, it being understood that the person skilled in the art is capable without difficulty of implementing the second step.

The objective usually given to the decoding is to associate with the received word the codeword situated at the shortest Hamming distance from this received word, the "Hamming distance" being, by definition, the number of places where two words of the same length have a different symbol. The shortest Hamming distance between two different codewords of a code is termed the "minimum distance" d of that code. This is an important parameter of the code. More particularly, it is in principle possible to find the position of the possible errors in a received word, and to provide the correct replacement symbol (i.e. that is identical to that sent by the transmitter) for each of those positions, each time the number of erroneous positions is at most equal to INT[(d-1)/2] (where "INT" designates the integer part) for a code of minimum distance d (for certain error configurations, it is sometimes even possible to achieve better). However, in all cases, the concern is not with a possibility in principle, since it is often difficult to develop a decoding algorithm achieving such performance. It should also be noted that, when the chosen algorithm manages to propose a correction for the received word, that correction is all the more reliable (at least, for most transmission channels) the smaller the number of positions it concerns.

Among known codes, "Reed-Solomon" codes may be cited, which are reputed for their efficiency. They are linear codes, of which the minimum distance d is equal to (n-k+1). The parity-check matrix H of the Reed-Solomon code of dimension k and length n (where n is necessarily equal to (q-1) or to a divisor of (q-1)) is a matrix with (n-k) lines and n columns, which has the structure of a Vandermonde matrix. This parity-check matrix H, which may be defined for example by taking $H_{ij} = \alpha^{i(j-1)}$ ($1 \leq i \leq n-k$, $1 \leq j \leq n$), where $\alpha$ is an $n^{th}$ root of unity in $F_q$; it is then possible to label the component $v_j$, where $1 \leq j \leq n$, of any codeword $\underline{v}=(v_1, v_2, \ldots, v_n)$ by means of the element $\alpha^{(j-1)}$ of $F_q$; it is for this reason that a set such as $(1, \alpha, \alpha^2, \ldots, \alpha^{n-1})$ is termed "locating set" of the Reed-Solomon code.

As mentioned above, the step of a method of decoding during which a "codeword associated with the received word" is calculated is usually divided into two sub-steps: the first sub-step referred to as an "error locating" sub-step, consists of identifying in the received word the components whose value is erroneous; and the second sub-step consists then of calculating the corrected value of those erroneous components.

For the decoding of Reed-Solomon codes, as regards error locating, use is usually made of the algorithm known as the "Berlekamp-Massey" algorithm, which will now be briefly described: firstly a matrix S is constructed, termed "syndromes matrix", of which each element is a certain component of the error syndromes vectors $\underline{s} = H \cdot \underline{r}^T = H \cdot \underline{e}^T$; next a vector $\underline{\Lambda}$ is sought such that $\underline{\Lambda} \cdot S = 0$, then a polynomial $\Lambda(Z)$ is formed of which the coefficients are components of the vector $\underline{\Lambda}$; the inverses of the roots of that polynomial $\Lambda(Z)$ are then, among the elements $\omega_i$ (where i=1, ..., n) of the locating set, those which label the erroneous components of the received word $\underline{r}$.

As regards the error correction, use is usually made of the algorithm known as the "Forney" algorithm which will now be briefly described. The error calculating polynomial $\Omega(Z) = \Lambda(Z)S(Z)$ modulo $Z^{n-k}$ is constructed, where $$S(Z) = \sum_{i=0}^{n-k-1} s_i Z^i$$

and the $s_i$ are the components of the error syndromes vector $\underline{s}$; the errors are then given, for i=1, ..., n, by:

$$e_i = \begin{cases} 0 & \text{if } \Lambda(\omega_i^{-1}) \neq 0 \\ -\dfrac{\Omega(\omega_i^{-1})}{p_i \Lambda'(\omega_i^{-1})} & \text{if } \Lambda(\omega_i^{-1}) = 0 \end{cases},$$

where $\Lambda'(Z)$ designates the derivative of $\Lambda(Z)$, and $p_i$ is equal to 1 for a "standard" Reed-Solomon code and at the diagonal element in position (i,i) of the matrix P for a modified code (see below).

For more details on Reed-Solomon codes, and in particular the algorithms of Berlekamp-Massey and of Forney, reference may for example be made to the work by R. E. Blahut entitled "*Theory and practice of error-control codes*", Addison-Wesley, Reading, Mass., 1983.

For modern information carriers, for example on computer hard disks, CDs ("compact discs") and DVDs ("digital video discs"), it is sought to increase the density of information. When such a carrier is affected by a physical defect such as a scratch, a high number of information symbols may be rendered unreadable. This problem may nevertheless be remedied by using a very long code. However, as indicated above, the length n of the words in Reed-Solomon codes is less than the size q of the alphabet of the symbols. Consequently, if a Reed-Solomon code is desired having codewords of great length, high values of q must be envisaged, which leads to costly implementations in terms of calculation and storage in memory. Moreover, high values of q are sometimes ill-adapted to the technical application envisaged. For this reason, it has been sought to build codes which naturally provide words of greater length than Reed-Solomon codes without however requiring a longer alphabet.

In particular so-called "algebraic geometric codes" or "Goppa geometric codes" have recently been proposed (see for example the article by Tom Høholdt and Ruud Pellikaan entitled "*On the Decoding of Algebraic-Geometric Codes*", IEEE Trans. Inform. Theory, vol. 41 n° 6, pages 1589 to 1614, November 1995). These codes are constructed from a set of n pairs (x,y) of symbols belonging to a chosen Galois field $F_q$; this set of pairs constitutes the locating set of the algebraic geometric code. In general terms, there is an algebraic equation with two unknowns X and Y such that the pairs (x,y) of that locating set are all solutions of that algebraic equation. The values of x and y of these pairs may be considered as coordinates of "points" $P_\beta$ (where $\beta=1, \ldots, n$) forming an "algebraic curve".

An important parameter of such a curve is its "genus" g. In the particular case where the curve is a simple straight line (the genus g is then zero), the algebraic geometric code reduces to a Reed-Solomon code. For given q and g, certain algebraic curves, termed "maximum", make it possible to achieve a length equal to $(q+2 g\sqrt{q})$, which may be very high; for example, with an alphabet size of 256 and a genus equal to 120, codewords are obtained of length 4096.

In the context of the present invention, a very general class of algebraic geometric codes is concerned: these codes, of which an example described in detail will be found below, are defined on an algebraic curve represented by an equation f(X, Y)=0 with $$f(X,Y) = X^b + cY^a + \Sigma c_{ij} Y^j X^i,$$

where $c \neq 0$ and the $c_{ij}$ are elements of $F_q$, a and b are strictly positive mutually prime integers, and where the sum only applies to the integers i and j which satisfy ai+bj<ab. This form of equation is referred to as "C(a,b)". For such a code, a parity-check matrix is conventionally defined in the following manner. With every monomial $Y^j X^i$, where i and j are positive integers or zero, a "weight" is associated (see below for details). If, for an integer $\rho \geq 0$, there is at least one monomial of which the weight is $\rho$, it is said that $\rho$ is an "achievable" weight. Let $\rho_1 < \rho_2 < \ldots < \rho_{n-k}$ be the (n−k) smallest achievable weights, and let $h_\alpha$ (where $\alpha=1, \ldots, n-k$) be a monomial of weight $\rho_\alpha$. The element in line $\alpha$ and column $\beta$ of the parity-check matrix is equal to the monomial $h_\alpha$ evaluated at the point $P_\beta$ (where, it may be recalled, $\beta=1, \ldots, n$) of the algebraic curve. Each point $P_\beta$ then serves to identify the $\beta^{th}$ component of any codeword. A code having such a parity-check matrix is termed a "one-point" code since its parity-check matrix is obtained by evaluating (at the n points $P^\beta$) functions (the monomials $h_\alpha$) which have poles only at a single point, i.e. the point at infinity.

Like all codes, algebraic geometric codes may be "modified" and/or "shortened". It is said that a given code $C_{mod}$ is a "modified" version of the code C if there is a square non-singular diagonal matrix A such that each word of $C_{mod}$ is equal to $\underline{v} \cdot A$ with $\underline{v}$ being in C. It is said that a given code is a "shortened" version of the code C if it comprises solely the words of C of which, for a number R of predetermined positions, the components are all zero: as these positions are known to the receiver, their transmission can be obviated, such that the length of the shortened code is (n−R). In particular, it is common to shorten an algebraic geometric code by removing from the locating set, where possible, one or more points for which the x coordinate is zero.

Algebraic geometric codes are advantageous as to their minimum distance d, which is at least equal to (n−k+1−g), and, as has been said, as to the length of the codewords, but they have the drawback of requiring decoding algorithms that are rather complex, and thus rather expensive in terms of equipment (software and/or hardware) and processing time. This complexity is in fact greater or lesser according to the algorithm considered, a greater complexity being in principle the price to pay for increasing the error correction capability of the decoder (see for example the article by Tom Høholdt and Ruud Pellikaan cited above). Generally, the higher the genus g of the algebraic curve used, the greater the length of the codewords, but also the greater the complexity of the decoding.

Various error locating algorithms are known for algebraic geometric codes (defined on a curve of non-zero genus).

Such an algorithm, termed "basic" algorithm, has been proposed by A. N. Skorobogatov and S. G. Vladut in the article entitled "*On the Decoding of Algebraic-Geometric Codes*", IEEE Trans. Inform. Theory, vol. 36 no. 5, pages 1051 to 1060, November 1990). Skorobogatov and Vladut have also proposed, in the same article cited above, a "modified" version of the "basic" algorithm, which generally enables a higher number of errors to be corrected that the "basic" algorithm.

Algorithms are also known which operate using an iterative principle: each new iteration of such an algorithm invokes a supplementary component of the syndromes vectors $\underline{s}=H\cdot\underline{r}^T$.

An example of such an iterative decoding algorithm is disclosed in the article by M. Sakata et al. entitled "*Generalized Berlekamp-Massey Decoding of Algebraic-Geometric Codes up to Half the Feng-Rao Bound*" (IEEE Trans. Inform. Theory, vol 41, pages 1762 to 1768, November 1995) This algorithm can be viewed as a generalization of the Berlekamp-Massey algorithm to algebraic geometric codes defined on a curve of non-zero genus.

Another example of an iterative decoding algorithm has been disclosed by M. O'Sullivan in the article "*A Generalization of the Berlekamp-Massey-Sakata Algorithm*" (preprint 2001).

All the error locating algorithms mentioned above provide "error locating polynomials" $\Lambda(x,y)$ of which the zeros comprise all the pairs $(x,y)$ labeling the components of the received word having suffered a transmission error. The set of the error locating polynomials forms an ideal, in which a basis known as a "Gröbner basis" can be defined.

The calculation of errors for algebraic geometric codes is prima facie more complicated than for Reed-Solomon codes. Thus:

- the error locating sub-step not only produces one error locating polynomial (denoted above $\Lambda(Z)$ for Reed-Solomon codes), but several polynomials, (belonging to the ideal of the error locating polynomials);
- these error locating polynomials are polynomials with two variables instead of one; and
- these error locating polynomials thus possess partial derivatives with respect to those two variables, such that the Forney formula given above, which involves a single derivative, is no longer applicable.

Various error calculating algorithms are known for algebraic geometric codes.

The article "*Algebraic Geometry Codes*", by Tom Høholdt, Jacobus Van Lint and Ruud Pelikaan (Chapter 10 of the "*Handbook of Coding Theory*", North Holland, 1998) constructs the product of certain powers of the polynomials of the Gröbner basis. It then performs a linear combination of those products, allocated with appropriate coefficients. Finally it shows that the value of the polynomial so obtained, taken at the point $(x,y)$ of the locating set is, with the sign being the only difference, the value of the error for the component of the received word labeled by that point $(x, y)$.

The article "*A Generalized Forney Formula for Algebraic Geometric Codes*" by Douglas A. Leonard (*IEEE Trans. Inform. Theory*, vol. 42, n° 4, pages 1263 to 1268, July 1996), and the article "*A Key Equation and the Computation of Error Values for Codes from Order Domains*" by John B. Little (published on the Internet on Apr. 7, 2003) calculate the values of the errors by evaluating a polynomial with two variables at the common zeros of the error locating polynomials.

These algorithms are complex to implement, in particular due to the fact that they comprise the multiplication of polynomials with two variables, in addition to formal multiplications in $F_q$.

U.S. patent application Ser. No. 10/746,144, which is incorporated herein by reference, describes a decoding method which performs both the location and the correction of errors. This decoding method applies to a vast set of codes, which include in particular the one-point algebraic geometric codes, described above, defined on an algebraic curve of type $C(a,b)$. This method will now be described in some detail.

This decoding method relies on the subdivision of the locating set of the code into subsets which we will term "aggregates". By definition, an "aggregate" groups together the pairs $(x,y)$ of the locating set having a common value of x (it would have been equally possible to define the aggregates with a common value of y by swapping the roles of the unknowns X and Y of the equation representing the algebraic curve on which the code is defined). When it is desired to emphasize this aggregate structure, the pairs of the locating set (which is furthermore not necessarily a set of solutions to an algebraic equation of type $C(a,b)$) will be denoted $(x,y_p(x))$, where $p=0, \ldots, \lambda(x)-1$ and $\lambda(x)$ is the cardinal of the aggregate considered, and the components of any word $\underline{c}$ of length n will be denoted $c(x,y_p(x))$; the components of $\underline{c}$ which, labeled in this manner, possess the same value of x, will be said to form an "aggregate of components" of the word $\underline{c}$.

Let m be the maximum weight of the monomials defining the lines of the parity-check matrix (see above). According to application Ser. No. 10/746,144, these monomials are classified in sets of monomials $$M_j=\{Y^j X^i | 0 \leq i \leq (m-bj)/a\}$$

for $0 \leq j \leq j_{max}$, where $j_{max}<a$. The cardinal of this set $M_j$ is thus:

$$t(j)=1+\mathrm{INT}[(m-bj)/a].$$

Let $x_1, x_2, \ldots, x_\mu$ denote the different values of x in the locating set, and $$\underline{v}=[v(x_1,y_0(x_1)), \ldots, v(x_1,y_{\lambda_1-1}(x_1)), \ldots, v(x_\mu,y_{\lambda_\mu-1}(x_\mu))],$$

denote any particular codeword for each aggregate attached to one of the values $x_1, x_2, \ldots, x_\mu$ of x, there are constructed $(j_{max}+1)$ "aggregate symbols"

$$v_j(x) \equiv \sum_{p=0}^{\lambda(x)-1} [y_p(x)]^j v(x, y_p(x))$$

for $j=0, \ldots, j_{max}$. These aggregate symbols serve to form $(j_{max}+1)$ "aggregate words"

$$\underline{v}_j=[v_j(x_1),v_j(x_2), \ldots, v_j(x_\mu)],$$

of length μ.

It is easily verified that the condition of belonging to the algebraic geometric code (i.e. $H \cdot \underline{v}^T=0$) is equivalent to the set of $(j_{max}+1)$ equations:

$$H^{(j)} \cdot \underline{v}_j^T = 0,$$

where the function t(j) is given above and is, by definition, $$H^t = \begin{bmatrix} 1 & 1 & \cdots & 1 \\ x_1 & x_2 & \cdots & x_\mu \\ \vdots & \vdots & \vdots & \vdots \\ x_1^{t-1} & x_2^{t-1} & \cdots & x_\mu^{t-1} \end{bmatrix}.$$

The advantage of this formulation is that the matrix $H^t$ of the equation is a Vandermonde matrix defined over $F_q$; consequently, if $H^{t(j)}$ is considered as a parity-check matrix defining codewords $\underline{v}_j$, we have here, for each value of j, a Reed-Solomon code, for which decoding algorithms are known which are simple as well as providing good performance;

For example, if a word $\underline{r}$ has been received, calculation is first made, for j=0, ..., $j_{max}$, of the "aggregate received words"

$$\underline{r}_j = [r_j(x_1), r_j(x_2), \ldots, r_j(x_\mu)],$$

in which, for x=$x_1, x_2, \ldots, x_\mu$, the "aggregate received words" $r_j(x)$ are given by $$r_j(x) = \sum_{p=0}^{\lambda(x)-1} [y_p(x)]^j r(x, y_p(x)); \quad (1)$$

next use is made of the Berlekamp-Massey algorithm for locating the erroneous symbols of each word $\underline{r}_j$, followed by the Forney algorithm for the correction of those erroneous symbols, according to the error syndromes vector $\underline{s}_j = H^{t(j)} \underline{r}_j^T$. Finally, the symbols $r(x, y_p(x))$ are calculated from the symbols $r_j(x)$ using the system of equations (1) (or an equivalent system); this system has a unique solution provided that $(j_{max}+1)$ (the number of equations) is at least equal to $\lambda_{max}$, where $\lambda_{max}$ is greatest of the aggregate cardinals $\lambda(x)$ (the number of unknowns).

Thus, with respect to the error correction algorithms mentioned previously, the saving in terms of complexity resulting from the use of the method according to application Ser. No. 10/746,144 is significant, despite the necessity to implement an error correction algorithm adapted to Reed-Solomon codes (for example the Forney algorithm) a certain number of times (at least equal to $\lambda_{max}$), and to solve for each erroneous aggregate labeled by some value x of X a system of equations (1) of size $\lambda(x)$; it will be noted however in this connection that $\lambda_{max}$ is at most equal to a, where a designates, it may be recalled, the exponent of Y in the equation representing the algebraic curve. It will furthermore be noted that the system of equations (1) is a Vandermonde system; as is well-known to the person skilled in the art, the solution of such a system of linear equations is particularly simple.

Furthermore, the implementation of this decoding method is particularly advantageous for a certain type of channel: these are the channels in which the data to transmit are grouped into blocks of predetermined length, and in which the error rate per item of data transmitted is essentially constant within the same block. In other words, such channels are physically characterized in that, most often, the transmission "noises" affect the data by block, and can differently affect different blocks; thus, for certain blocks, the probability of error can be very low or even zero, however for certain other blocks the probability of error could be high and even close to (q−1)/q. This results in a "burst of errors" in terms of symbols of the Galois field.

An example of channels of this type, which is of importance in industrial implementation, is constituted by writing/reading on a hard disk.

This is because the bits composing the symbols of the codewords are usually written by means of a "modulation code" adapted to ensure that certain desirable "spectral" properties are verified, for example the property that the number of 1's, on average, is approximately equal to the number of 0's. To obtain this result, the bits entering the modulator are grouped into blocks $\underline{a}$ of N bits; depending on the balance between the total number of 1's and the total number of 0's already written, a block $\underline{\alpha}$ will be written on the disk, either just as it is, or in the form of its complement $\underline{a}'$ (where each 1 has been changed into a 0 and vice-versa), such that the new balance is as close as possible to equality.

When a writing/reading error occurs in a particular bit, the resulting ambiguity in the modulation encoding means that it is not possible to individually correct that bit, and that, in practice, it is necessary to accept having to consider the entire block of N bits as erroneous. As it is moreover considered that the bits written and read form strings representing symbols in a Galois field, an erroneous block of N bits will generally encroach on several symbols; for example, if N=48 and $q=2^{10}$, an erroneous block could encroach on 6 strings of 10 successive bits, which results in a burst of errors affecting 6 symbols of the Galois field.

It can thus be seen that the decoding method according to application Ser. No. 10/746,144, which in the first instance corrects erroneous aggregates associated with the received word and not individual erroneous components of that word, is well-adapted to take advantage of such a distribution of the noise on a transmission channel. For this it suffices to insert in an adjacent position in the data stream to be transmitted the components of a (channel) codeword belonging to the same aggregate.

On the other hand, and for the same reason, the number of individual errors which can be corrected with this method may be less than the theoretical error correction capability of the code (as explained above, that theoretical capability is equal to INT[(d−1)/2], where d is the minimum distance of the algebraic geometric code considered). This being the case, the question arises of whether the codes able to benefit from this decoding method all suffer from this drawback to the same extent.

SUMMARY OF THE INVENTION

Thus, according to a first aspect, the invention concerns a method of encoding information symbols, comprising a step in which a word $\underline{v}$ belonging to a code Q of length n is associated with every block of k information symbols belonging to a Galois field $F_q$, where q is an integer greater than 2 and equal to a power of a prime number. This method is remarkable in that the parity-check matrix of said code Q is equal to the matrix H which is obtained by:

choosing a one-point algebraic geometric code Q' defined on an algebraic curve of type C(a,b) represented by an equation of degree b in X and of degree a≧3 in Y, classifying the monomials associated with said code Q', which are of maximum weight m, in sets of monomials $$M'_j = \{Y^j X^i | 0 \le i \le (m-bj)/a\}$$

for $0 \le j \le j_{max}$, with $\lambda_{max} - 1 \le j_{max} < a$, where $\lambda_{max}$ is the greatest of the aggregate cardinals $\lambda(x)$, each "aggregate" grouping together the pairs (x,y) of the locating set of said code Q' having a common value of x, choosing an integer J satisfying $0 \leq J \leq j_{max}$, constituting a set of monomials $M_J$ obtained from $M'_J$ by adding at least one monomial $Y^J X^i$, where the values of i start at $(1+(m-bJ)/a)$ and increase, and sets of monomials $M_j$, where $0 \leq j \leq j_{max}$ except for j=J, of which each is either identical to the corresponding set $M'_j$, or is obtained from that set $M'_j$ by removing at least one monomial $Y^j X^i$ where the values of i start at $(m-bj)/a$ and decrease, such that:

$$\sum_{j=0}^{j_{max}} t(j) = n - k, \text{ and}$$

$$t(J) \leq 2t(j) \text{ for all } j \neq J,$$

where $t(j)$ denotes the cardinal of the set $M_j$, defining a locating set for the code Q by choosing n separate elements of $F_q \times F_q$, and associating a respective line of said matrix H with each of the monomials belonging to one of said sets $M_j$, where $0 \leq j \leq j_{max}$, that line being constituted by the values taken by that monomial at the points of said locating set of the code Q.

Indeed, by analyzing the decoding method according to application Ser. No. 10/746,144 in detail, the authors of the present invention have realized that the maximum number of erroneous aggregates which can be located by means of that method was principally determined by the first Reed-Solomon decoding step, which will be associated here with the parity-check matrix $H^{t(J)}$. This number of aggregates which can be located is thus equal to $INT[t(J)/2]$, and the number of aggregates which can be corrected will also generally be equal to $INT[t(J)/2]$ provided that the steps of Reed-Solomon decoding that follow the first reach completion; it can be shown that this last condition requires that $t(J) \leq 2t(j)$ for all $j \neq J$.

By virtue of the present invention, not only are the advantages mentioned above of the decoding method based on aggregates according to application Ser. No. 10/746,144 benefited from, but in addition it is known how to select, among all the codes to which that decoding method is applicable, those which provide a better correction capability, for each code Q according to the invention, than that of an algebraic geometric code Q' of the same length and dimension (the codes Q and Q' are, naturally, both assumed to be decoded by means of said method based on aggregates). More particularly, to increase by one unit, at the first decoding step, the number of aggregates that can be located, it is necessary to add one monomial $Y^J X^i$ (with $i=1+(m-bJ)/a$) to the set $M'_J$ if the cardinal of $M'_J$ is odd, but it is necessary to add two monomials $Y^J X^i$ (with $i=1+(m-bJ)/a$, and $i=2+(m-bJ)/a$) if that cardinal is even.

To constitute the set $M_j$, it is of course possible to add still other monomials $Y^j X^i$ to the set $M'_j$, in order to increase still further the number of aggregates that can be located at the first decoding step. In doing this, according to the invention, monomials are withdrawn from the other sets of monomials so as to maintain the redundancy of the code.

It is however clear that the process will find itself limited with respect to the conditions $t(J) \leq 2t(j)$ for all $j \neq J$. That being the case, it is not necessarily desirable (the case arising) to have $t(J)$ strictly equal to $2t(j)$ for all $j \neq J$. This is because it may occasionally occur, for some erroneous aggregate labeled by x, that $E_J(x)=0$, but $E_D(x) \neq 0$ where D is some value of $j \neq J$.

and where, if $e(x, y_p(x))$ designates the error in the component $r(x, y_p(x))$ (where $p=0, \ldots, \lambda(x)-1$) of the received word $\underline{r}$, then $E_j(x)$ designates the "aggregate error" affecting the aggregate word $r_j(x)$ and satisfies $$E_j(x) = \sum_{p=0}^{\lambda(x)-1} [y_p(x)]^j e(x, y_p(x)) \qquad (2)$$

whatever the value of j (see system of equations (1)). In this case, the non-zero errors $e(x, y_p(x))$ in the aggregate labeled by x, which could be referred to as "twin errors", are not located during the decoding associated with j=J, but during the later decoding associated with j=D. When the number of erroneous aggregates is either equal to $t(J)/2$, or even is less than $t(J)/2$ but remaining close to that value, the location of these twin errors during the decoding associated with j=D can only be performed if there is "supplementary" redundancy, that is to say greater than $t(J)/2$; in other words, the choice of $t(J)=2t(j)$ for all $j \neq J$ would only enable correction of the errors which have been located during the first decoding (the one associated with j=J), and would not enable correction of the twin errors. It should nevertheless be noted that the occurrence of twin errors is relatively rare.

Given the above, according to particular features, the additional condition:

$$t(j) \leq \frac{t(J)}{2} + \sqrt{t(J)}$$

is imposed for all $j \neq J$.

Thus, in this embodiment, each $t(j)$ for $j \neq J$ is found to be "slightly" greater than the lower limit $t(J)/2$ provided by the invention. By virtue of these provisions, the capability of locating erroneous aggregates during the decoding associated with j=J is virtually optimal, and it is even possible in addition to correct a certain number of twin errors.

According to other particular features, the locating set of said code Q is identical to the locating set of said code Q'.

By virtue of these provisions, it is possible to obtain a particularly "robust" decoding method in that it is possible, by using certain properties of the algebraic equations, to incorporate in that method means which, in most cases in which the number of errors in a received word exceeds the correction capability of the algorithm, enable that lack of capability to be detected, instead of leading to a "false" correction. This detection of course enables the user to provide a suitable response, for example recourse to another more powerful correction algorithm to decode that received word.

However, other choices (whether or not incompatible) than the latter as to the locating set of the code may also prove to be very worthwhile in an implementation of the invention. Thus, according to other particular features, a fixed cardinal $\lambda$ is chosen for all the aggregates, and for each coordinate $y_p(x)$, where $p=0, \ldots, \lambda-1$, a fixed value $y_p$ is chosen for given p.

By virtue of these provisions, the system of equations (1) has coefficients that are invariable from one aggregate to another, which makes the solution of the system of equations (1) (or its equivalent (2)) even faster during decoding.

Naturally, the invention also concerns encoding methods implementing codes obtained by modifying or by shortening a code as succinctly defined above.

The invention also concerns, according to the same first aspect, a method of communicating data. This communication method comprises the following steps:

a) encoding the data to transmit, in accordance with one of the methods of encoding succinctly described above, b) transmitting the encoded data in the form of blocks of predetermined length, and c) decoding the data received in accordance with a decoding method based on aggregates.

As explained above, advantage is thus taken of an error correction algorithm relatively simple to implement, while reducing the rate of errors occurring on said communication and going beyond the correction capability of the algorithm.

The invention proposes an encoding method comprising the steps of:

choosing a first algebraic geometric code defined on an algebraic curve represented by an equation of two variables, and each symbol of the first algebraic geometric code belonging to a Galois field;

classifying monomials associated with the first algebraic geometric code into a first plurality of subsets of monomials based on respective orders of one of the two variables;

constituting a second plurality of subsets of monomials by adding at least one monomial to at least one subset of the first plurality of subsets of monomials and removing at least one monomial from at least one subset of the first plurality of subsets of monomials;

defining a locating set for a second algebraic geometric code by choosing separate elements of the number identical to the length of the second algebraic geometric code from a product set of the Galois field, i.e. $F_q \times F_q$;

generating a parity check matrix of the second algebraic geometric code by taking values of the second plurality of subsets of monomials at the locating set for the second algebraic geometric code; and encoding information symbols into a codeword belonging to the second algebraic geometric code on the basis of the parity check matrix.

The invention also proposes a method of encoding information symbols into a codeword on the basis of a parity check matrix, wherein the parity check matrix is defined by taking values, at points of a locating set, of monomials from a plurality of subsets of monomials with two variables, each subset grouping monomials having a common power with respect to one variable of said two variables, and wherein a first subset of monomials has a cardinal closer to twice the cardinal of a second subset than to the cardinal of said second subset.

This allows benefiting in a particularly efficient manner from the effect described above.

According to a second aspect, the invention concerns a decoding device adapted to associate a codeword $\underline{v}$ belonging to a code Q of length n with any block of k information symbols belonging to a Galois field $F_q$, where q is an integer greater than 2 and equal to a power of a prime number. This device is remarkable in that the parity-check matrix of said code Q is equal to the matrix H which is obtained by:

having chosen a one-point algebraic geometric code Q defined on an algebraic curve of type C(a,b) represented by an equation of degree b in X and of degree $a \geq 3$ in Y, having classified the monomials associated with said code Q', which are of maximum weight m, in sets of monomials $$M'_j = \{Y^j X^i | 0 \leq i \leq (m-bj)/a\}$$

for $0 \leq j \leq j_{max}$, with $\lambda_{max} - 1 \leq j_{max} < a$, where $\lambda_{max}$ is the greatest of the aggregate cardinals $\lambda(x)$, each "aggregate" grouping together the pairs (x,y) of the locating set of said code Q' having a common value of x, having chosen an integer J satisfying $0 \leq J \leq j_{max}$, having constituted a set of monomials $M_J$ obtained from $M'_J$ by adding at least one monomial $Y^J X^i$, where the values of i start at $(1+(m-bJ)/a)$ and increase, and sets of monomials $M_j$, where $0 \leq j \leq j_{max}$ except for j=J, of which each is either identical to the corresponding set $M'_j$, or is obtained from that set $M'_j$ by removing at least one monomial $Y^j X^i$ where the values of i start at $(m-bj)/a$ and decrease, such that:

$$\sum_{j=0}^{j_{max}} t(j) = n - k, \text{ and}$$

$$t(J) \leq 2t(j) \text{ for all } j \neq J,$$

where t(j) denotes the cardinal of the set $M_j$, having defined a locating set for the code Q by choosing n separate elements of $F_q \times F_q$, and having associated a respective line of said matrix H with each of the monomials belonging to one of said sets $M_j$, where $0 \leq j \leq j_{max}$, that line being constituted by the values taken by that monomial at the points of said locating set of the code Q.

According to particular features, the supplementary conditions $$t(j) \leq \frac{t(J)}{2} + \sqrt{t(J)}$$

have been imposed for all $j \neq J$.

According to other particular features, the locating set of said code Q is identical to the locating set of said code Q'.

According to other particular features, to define the locating set of said code Q, a fixed cardinal $\lambda$ has been chosen for all the aggregates, and for each coordinate $y_p(x)$, where $p=0, \ldots, \lambda-1$, a fixed value $y_p$ has been chosen for given p.

Naturally, the invention also concerns encoding devices implementing codes obtained by modifying or by shortening a code as succinctly defined above.

The advantages of these encoding devices are essentially the same as those of the methods complementary thereto described succinctly above.

The invention also relates to:

an apparatus for recording encoded digital signals, comprising an encoding device as succinctly described above, means for modulating said encoded digital signals, and a modulated data recorder, an apparatus for transmitting encoded digital signals, comprising an encoding device as succinctly described above, means for modulating said encoded digital signals, and a modulated data transmitter, a data storage system comprising at least one apparatus for recording digital signals as succinctly described above, at least one recording medium, and at least one apparatus for reading encoded digital signals, a system for telecommunicating data in the form of blocks of predetermined length, comprising at least one apparatus for transmitting encoded digital signals as succinctly described above, and at least one apparatus for receiving encoded digital signals, a non-removable data storage means comprising computer program code instructions for the execution of the steps of any one of the methods of encoding and/or communicating succinctly described above, a partially or totally removable data storage means comprising computer program code instructions for the execution of the steps of any one of the methods of encoding and/or communicating succinctly described above, a computer program containing instructions such that, when said program controls a programmable data processing device, said instructions lead to said data processing device implementing one of the methods of encoding and/or of communicating succinctly described above.

The advantages provided by these recording or transmitting apparatuses, these systems for data telecommunication or data storage, these means for data storage and this computer program are essentially the same as those provided by the methods of encoding and communicating according to the invention.

BRIEF DESCRIPTION OF THE DRAWINGS

Other aspects and advantages of the invention will emerge from a reading of the following detailed description of particular embodiments, given by way of non-limiting example. The description refers to the accompanying drawings, in which.

DETAILED DESCRIPTION OF A PREFERRED EMBODIMENT

Figure 1:
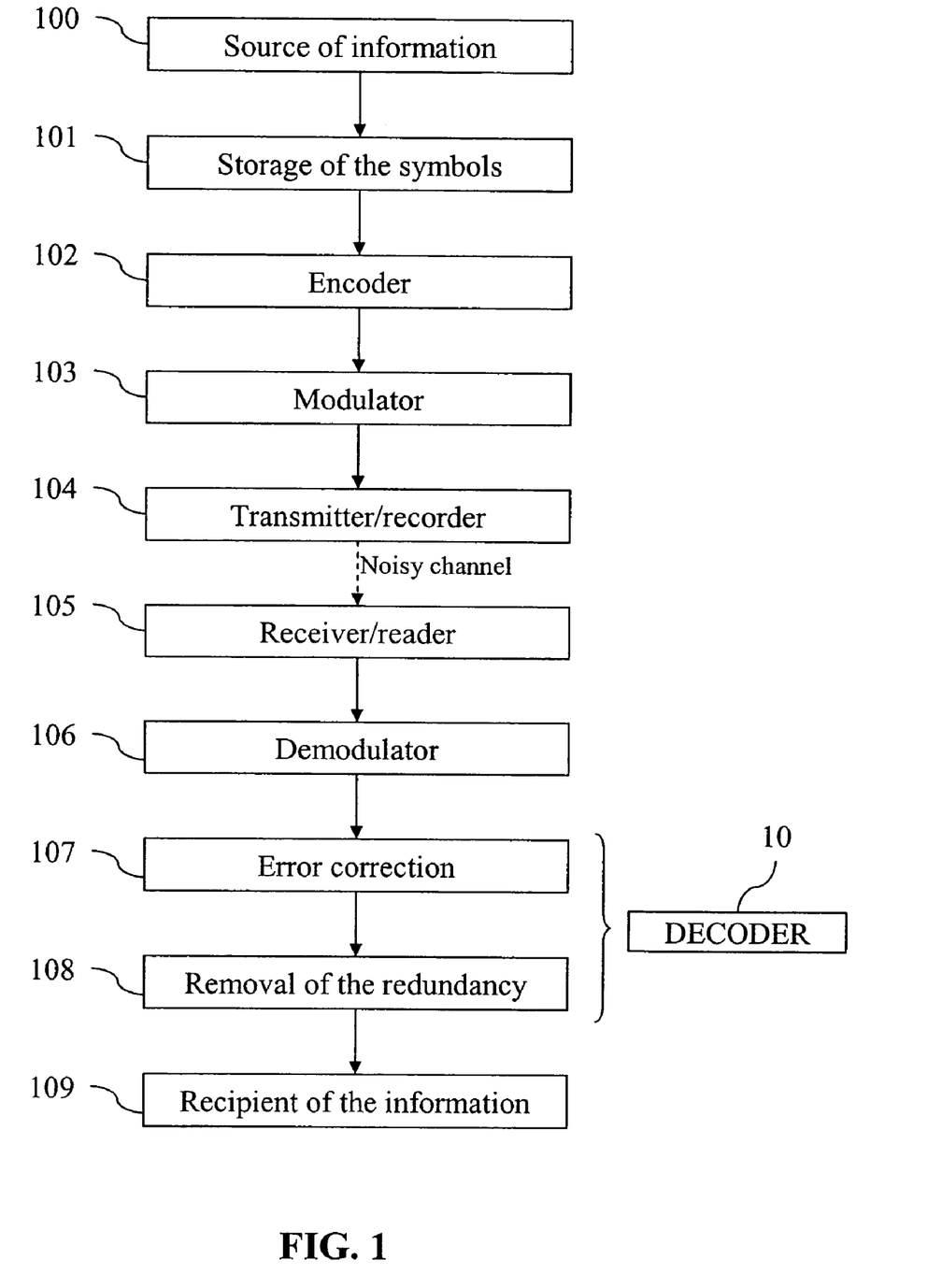
FIG. 1 is a block diagram of a system for transmitting information according to one embodiment of the invention.

FIG. 1 is a block diagram of a system for transmitting information using a channel encoding according to the invention.

The function of this system is to transmit information of any nature from a source 100 to a recipient or user 109. First of all, the source 100 puts this information into the form of symbols belonging to a certain alphabet (for example bytes), and transmits these symbols to a storage unit 101, which accumulates the symbols so as to form sets each containing k symbols. Next, each of these sets is transmitted by the storage unit 101 to an encoder 102 which incorporates the redundancy therein, so as to construct a codeword of length n belonging to the chosen code.

The codewords so formed are next transmitted to a modulator 103, which associates with each symbol of the codeword a modulation symbol (for example, a series of bits conforming to a modulation code, as explained above). Next, these modulation symbols are transmitted to a recorder (or a transmitter) 104, which inserts the symbols in a transmission channel. This channel may for example be storage on a suitable carrier such as a DVD or a magnetic disc or magnetic tape. It may also correspond to be a wired transmission or wireless transmission as is the case with a radio link.

The message transmitted arrives at a reader (or a receiver) 105, after having been affected by a "transmission noise" whose effect is to modify or erase some of the modulation symbols.

The reader (or receiver) 105 then transmits these symbols to the demodulator 106, which transforms them into symbols of the alphabet mentioned above. The n symbols resulting from the transmission of the same codeword are next grouped together into a "received word" in an error correction unit 107, which implements a decoding method according to the invention, so as to provide an "associated codeword". Next, this associated codeword is transmitted to a redundancy removal unit 108, which extracts from it k information symbols by implementing a decoding algorithm that is the reverse of that implemented by the encoder 102. Finally, these information symbols are supplied to their recipient 109.

Units 107 and 108 can be considered to form conjointly a "decoder" 10.

The encoding method according to the invention will now be illustrated, with the aid of a numerical example. Note that this example does not necessarily constitute a preferred choice of parameters for the encoding or decoding. It is provided here to enable the person skilled in the art to understand more easily the operation of the method according to the invention.

An algebraic geometric code Q' will thus be considered of dimension 34 and length 60 defined as follows.

The alphabet of the symbols is constituted by the Galois field $F_{16}$. As the cardinal of this field is a power of 2 ($16=2^4$), the sign "+" is equivalent to the sign "−" before any coefficient of a polynomial with coefficients belonging to that field.

The following "algebraic curve" is then considered of genus g=6 constituted by the set of the solutions (X=x, Y=y) of the equation with two unknowns $$Y^4+Y+X^5=0 \qquad (3)$$

over $F_{16}$. It is found that by giving to X some particular value x in $F_{16}$, each time there are 4 values $y_p(x)$ (p=0, 1, 2, 3) in $F_{16}$ such that the pair $(x, y_p(x))$ is a solution of equation (3); these solutions of equation (3) are the coordinates of the "finite points of the curve" (the curve also contains a point at infinity denoted $P_\infty$). It is chosen to constitute the locating set by means of all these solutions except those where x=0; the locating set thus has a cardinal equal to 60, and it can be divided into 15 aggregates which each have a cardinal $\lambda(x)$ equal to 4. It may be recalled that each point $P_\beta$ of the locating set serves to identify the $\beta^{th}$ element of any codeword; the number of such points being here equal to 60, the length n of the code is thus also equal to 60.

Next, the vector space $L(m P_\infty)$ is considered of polynomials in X and Y with coefficients in $F_{16}$ of which solely the poles are situated in $P_\infty$, and are of order less than or equal to m, where m is a strictly positive integer (the image of this space of polynomials on the finite points of the curve represented by equation (3) is thus a "one-point" algebraic geometric code). This vector space, which is of dimension greater than or equal to (m−g+1) (equal if m>2 g−2), has a base constituted by the monomials $h'_\alpha = Y^j X^i$, where j is an integer between 0 and 3, i is a positive integer or zero, $4i+5j \leq m$, and $\alpha=1, \ldots, n-k$. This quantity $\rho(h_\alpha)=4i+5j$ is called the "weight" of the monomial $h'_\alpha$.

Take for example: m=31; a set of monomials $h'_\alpha$ where $\alpha=1, \ldots, 26$ is then obtained since:

$$m-g+1=31-6+1=26.$$

The monomials $h'_\alpha$ may be classified into ordered subsets of monomials $$M'_j = \{Y^j X^i | 0 \leq i \leq (31-5j)/4\},$$

for $0 \leq j \leq 3$. These ordered subsets of monomials are explicitly:

$$M'_0 = \{1, X, X^2, X^3, X^4, X^5, X^6, X^7\},$$

$$M'_1 = \{Y, YX, YX^2, YX^3, YX^4, YX^5, XY^6\},$$

$$M'_2 = \{Y^2, Y^2X, Y^2X^2, Y^2X^3, Y^2X^4, Y^2X^5\}, \text{ and}$$

$$M'_3 = \{Y^3, Y^3X, Y^3X^2, Y^3X^3, Y^3X^4\}.$$

It is verified that the total number of monomials $h_\alpha$ is indeed equal to: $8+7+6+5=26$.

For example it is possible for example to take as parity-check matrix $H'$ of this code $Q'$ the matrix of which the element $H'\alpha\beta$ in line $\alpha$ and column $\beta$ is equal to the value taken by the monomial $h'_\alpha$ at the point $P_\beta$ of the algebraic curve.

The redundancy (n−k) of the code Q' being equal to 26, its dimension is k=34. The minimum distance d of this code is at least equal to n−k+1−g=21. It is thus possible to correct (at least) INT[(21−1)/2]=10 symbols having undergone a transmission error if a decoding algorithm having this maximum error correction capability is used; as explained above, such algorithms are complex to implement.

In accordance with the invention, there is now constructed, on the basis of this code Q', a code Q of the same length 60 and same dimension 34 as the code Q'; the code Q thus also has a redundancy: n−k=26. In this embodiment, a locating set identical to the code Q' will be taken as the code Q. Furthermore, it is chosen to associate with the code Q the monomials $h_\alpha$, where $\alpha=1, \ldots, 26$, that are to be found below classified into ordered sets of monomials $M_j$, where $0 \leq j \leq 3$:

$$M_0 = \{1, X, X^2, X^3, X^4, X^5, X^6, X^7, X^8, X^9\},$$

$$M_1 = \{Y, YX, YX^2, YX^3, YX^4 YX^5\},$$

$$M_2 = \{Y^2, Y^2X, Y^2X^2, Y^2X^3, Y^2X^4\}, \text{ and}$$

$$M_3 = \{Y^3, Y^3X, Y^3X^2, Y^3X^3, Y^3X^4\}$$

(the choice of J=0 has thus been made). It is verified that the total number of monomials $h_\alpha$ is indeed equal to: $10+6+5+5=26$.

For example it is possible for example to take as parity-check matrix H of the code Q the matrix of which the element $H_{\alpha\beta}$ in line $\alpha$ and column $\beta$ is equal to the value taken by the monomial $h_\alpha$ at the point $P_\beta$ of the algebraic curve.

An error locating capacity by aggregates equal (in most cases) to INT[t'(0)/2]=4 has thus been increased to an error locating capacity by aggregates equal (in most cases) to INT[t(0)/2]=5.

Using a numerical example, illustration will now be given of the decoding of a received word $\underline{r}$ associated with a sent word belonging to that code Q. For this, let the choice of primitive element of $F_{16}$ be a root $\alpha$ of the equation $$Z^4 + Z + 1 = 0.$$

Assume that a word $\underline{r}$ is received producing, for j going from 0 to 3, the following error syndromes vectors (naturally, with t(j) components):

$$\underline{s}_0 = H^{t(0)} \cdot \underline{r}_0^T = [\alpha^{13} \alpha^2 \alpha^5 \alpha^9 \alpha^{13} \alpha^{10} \alpha^9 \alpha^{14} \alpha^6 \alpha^6]^T,$$

$$\underline{s}_1 = H^{t(1)} \cdot \underline{r}_1^T = [\alpha^9 \alpha^3 \alpha^2 \alpha^{12} \alpha^4 \alpha^4]^T,$$

$$\underline{s}_2 = H^{t(2)} \cdot \underline{r}_2^T = [\alpha^4 \alpha^3 \alpha^9 \alpha 0]^T, \text{ and}$$

$$\underline{s}_3 = H^{t(3)} \cdot \underline{r}_3^T = [\alpha^{10} \alpha^7 \alpha^6 \alpha^{11} \alpha^{10}]^T.$$

Apply the Berlekamp-Massey algorithm to the aggregate word $\underline{r}_0$. The following error locating polynomial is thus obtained:

$$\Lambda_0(Z) = 1 + \alpha^{10} Z + \alpha^{11} Z^2 + \alpha^5 Z^3 + Z^4 + \alpha^{12} Z^5,$$

which factorizes in the following manner:

$$\Lambda_0(Z) = (1-Z)(1-\alpha Z)(1-\alpha^5 Z)(1-\alpha^7 Z)(1-\alpha^{14} Z).$$

Through application of the Berlekamp-Massey algorithm to the aggregate word $\underline{r}_1$, initializing with $\Lambda(Z)=\Lambda_0(Z)$, the error locating polynomial $\Lambda_1(Z)=\Lambda_0(Z)$ is obtained. This step does not thus provide any new erroneous aggregate.

Through application of the Berlekamp-Massey algorithm to the aggregate word $\underline{r}_2$, initializing with $\Lambda(Z)=\Lambda_1(Z)$, the error locating polynomial $\Lambda_2(Z)=\Lambda_1(Z)$ is obtained. This step does not thus provide any new erroneous aggregate.

Through application of the Berlekamp-Massey algorithm to the aggregate word $\underline{r}_3$, initializing with $\Lambda(Z)=\Lambda_2(Z)$, the error locating polynomial $\Lambda_3(Z)=\Lambda_2(Z)$ is obtained. This step does not thus provide any new erroneous aggregate.

The erroneous aggregates are thus associated with the following values of x:

$$x_1=1, x_2=\alpha, x_3=\alpha^5, x_4=\alpha^7, x_5=\alpha^{14}.$$

These aggregates are of cardinal 4 (as in this case in fact are all the aggregates of this locating set) and consequently: $\lambda_{max}=4$.

For the correction of the aggregate errors $E_j(x)$ affecting each aggregate word, the Forney algorithm can for example be used, applied to $\Lambda_3(Z)$. The following is thus obtained:

$$E_0(1)=\alpha^{11}, E_0(\alpha)=\alpha^{11}, E_0(\alpha^5)=\alpha^{11}, E_0(\alpha^7)=\alpha^{11}, E_0(\alpha^{14})=\alpha^{13},$$

$$E_1(1)=\alpha^6, E_1(\alpha)=\alpha^2, E_1(\alpha^5)=\alpha^{12}, E_1(\alpha^7)=\alpha^9, E_1(\alpha^{14})=\alpha^{10},$$

$$E_2(1)=\alpha^7, E_2(\alpha)=\alpha^9, E_2(\alpha^5)=\alpha^{11}, E_2(\alpha^7)=0, E_2(\alpha^{14})=\alpha^6, \text{ and}$$

$$E_3(1)=0, E_3(\alpha)=\alpha^{11}, E_3(\alpha^5)=\alpha^7, E_3(\alpha^7)=\alpha^9, E_3(\alpha^{14})=\alpha^{12}.$$

The last step of the algorithm for correction by aggregates consists of grouping together the above results aggregate by aggregate, and of calculating the estimations $\hat{e}(x, y_p(x))$ of the respective errors in the components $r(x, y_p(x))$, where $p=0, \ldots, \lambda(x)-1$, of $\underline{r}$ by solving the Vandermonde system of equations:

$$E_j(x) = \sum_{p=0}^{\lambda(x)-1} [y_p(x)]^j \hat{e}(x, y_p(x)), \text{ where } j = 0, \ldots, j_{max},$$

(see system of equations (2)) for each aggregate. In this case, these systems of equations are of size $j_{max}+1=4$, and all the aggregates have a cardinal $\lambda(x)=4$. Thus:

for $x_1=1$, knowing that $$y_0(1)=\alpha, y_1(1)=\alpha^2, y_2(1)=\alpha^4, y_3(1)=\alpha^8,$$

it is found that:

$$\hat{e}(1, y_0(1))=0, \hat{e}(1, y_1(1))=0, \hat{e}(1, y_2(1))=\alpha^7, \hat{e}(1, y_3(1))=\alpha^8;$$

for $x_2=\alpha$, knowing that $$y_0(\alpha)=\alpha^6, y_1(\alpha)=\alpha^7, y_2(\alpha)=\alpha^9, y_3(\alpha)=\alpha^{13},$$

it is found that:

$$\hat{e}(\alpha,y_0(\alpha))=1, \hat{e}(\alpha,y_1(\alpha))=\alpha^2, \hat{e}(\alpha,y_2(\alpha))=\alpha^7, \hat{e}(\alpha, y_3(\alpha))=0;$$

for $x_3=\alpha^5$, knowing that $$y_0(\alpha^5)=\alpha^3, y_1(\alpha^5)=\alpha^{11}, y_2(\alpha^5)=\alpha^{12}, y_3(\alpha^5)=\alpha^{14},$$

it is found that:

$$\hat{e}(\alpha^5,y_0(\alpha^5))=\alpha, \hat{e}(\alpha^5,y_1(\alpha^5))=\alpha^2, \hat{e}(\alpha^5,y_2(\alpha^5))=\alpha^3, \hat{e}(\alpha^5,y_3(\alpha^5))=0;$$

for $x_4=\alpha^7$, knowing that $$y_0(\alpha^7)=\alpha^6, y_1(\alpha^7)=\alpha^7, y_2(\alpha^7)=\alpha^9, y_3(\alpha^7)=\alpha^{13},$$

it is found that:

$$\hat{e}(\alpha^7,y_0(\alpha^7))=1, \hat{e}(\alpha^7,y_1(\alpha^7))=\alpha^8, \hat{e}(\alpha^7,y_2(\alpha^7))=\alpha^{11}, \hat{e}(\alpha^7,y_3(\alpha^7))=\alpha^2;$$

and for $x_5=\alpha^{14}$, knowing that $$y_0(\alpha^{14})=\alpha^3, y_1(\alpha^{14})=\alpha^{11}, y_2(\alpha^{14})=\alpha^{12}, y_3(\alpha^{14})=\alpha^{14},$$

it is found that:

$$\hat{e}(\alpha^{14},y_0(\alpha^{14}))=1, \hat{e}(\alpha^{14},y_1(\alpha^{14}))=0, \hat{e}(\alpha^{14},y_2(\alpha^{14}))=\alpha^9, \hat{e}(\alpha^{14},y_3(\alpha^{14}))=\alpha^5.$$

The code Q according to the invention thus has been capable, in this numerical example, of correcting the 15 individual errors contained in the received word. This result must now be compared to the error correction capability of the algebraic geometric code Q' described above. Naturally, the words of the code Q' are in general different from the words of the code Q, but, for the purposes of comparison, let it be assumed that the errors, and consequently the aggregate errors $E_j(x)$, affecting a certain received word are the same as those which have just been calculated. In this case, since t'(0)=8, the error syndromes vector for the Reed-Solomon code associated with j=0 comprises the 8 first components of the corresponding vector mentioned above, i.e.:

$$\underline{s}'_0 = H^{t'(0)} \cdot \underline{E}_0^T = [\alpha^{13} \alpha^2 \alpha^5 \alpha^9 \alpha^{13} \alpha^{10} \alpha^9 \alpha^{14}]^T.$$

The application of the Berlekamp-Massey algorithm then provides the error locating polynomial:

$$\Lambda'_0(Z) = 1 + \alpha^{13}Z + \alpha^{10}Z^3 + Z^4.$$

However, this polynomial has no roots in $F_{16}$. The algorithm for error correction by aggregates thus proves in this case incapable of detecting any of the 15 errors affecting the received word.

Assuming that they are decoded by means of an algorithm by aggregates, code Q' will only (in most cases) be able to correct words containing at most t'(0)/2=4 erroneous aggregates, whereas code Q will (in most cases) be able to correct words containing at most t(0)/2=5 erroneous aggregates.

It is to be noted that even if it is sought to correct the errors in a word belonging to Q' using a conventional algorithm for correcting individual errors (such as the O'Sullivan algorithm), it will normally not be possible to correct more than 10 errors. This is to be compared to the correction capability of the code Q according to the invention when it is decoded with an algorithm by aggregates, which (in most cases) is between 5×1=5 (a single error per erroneous aggregate) and 5×4=20 (4 errors per erroneous aggregate); it has thus been possible to correct 15 individual errors in the above example. It can easily be understood that the code according to the invention is particularly advantageous in the case of channels in which the transmission errors tend to occur in bursts.

Figure 2:
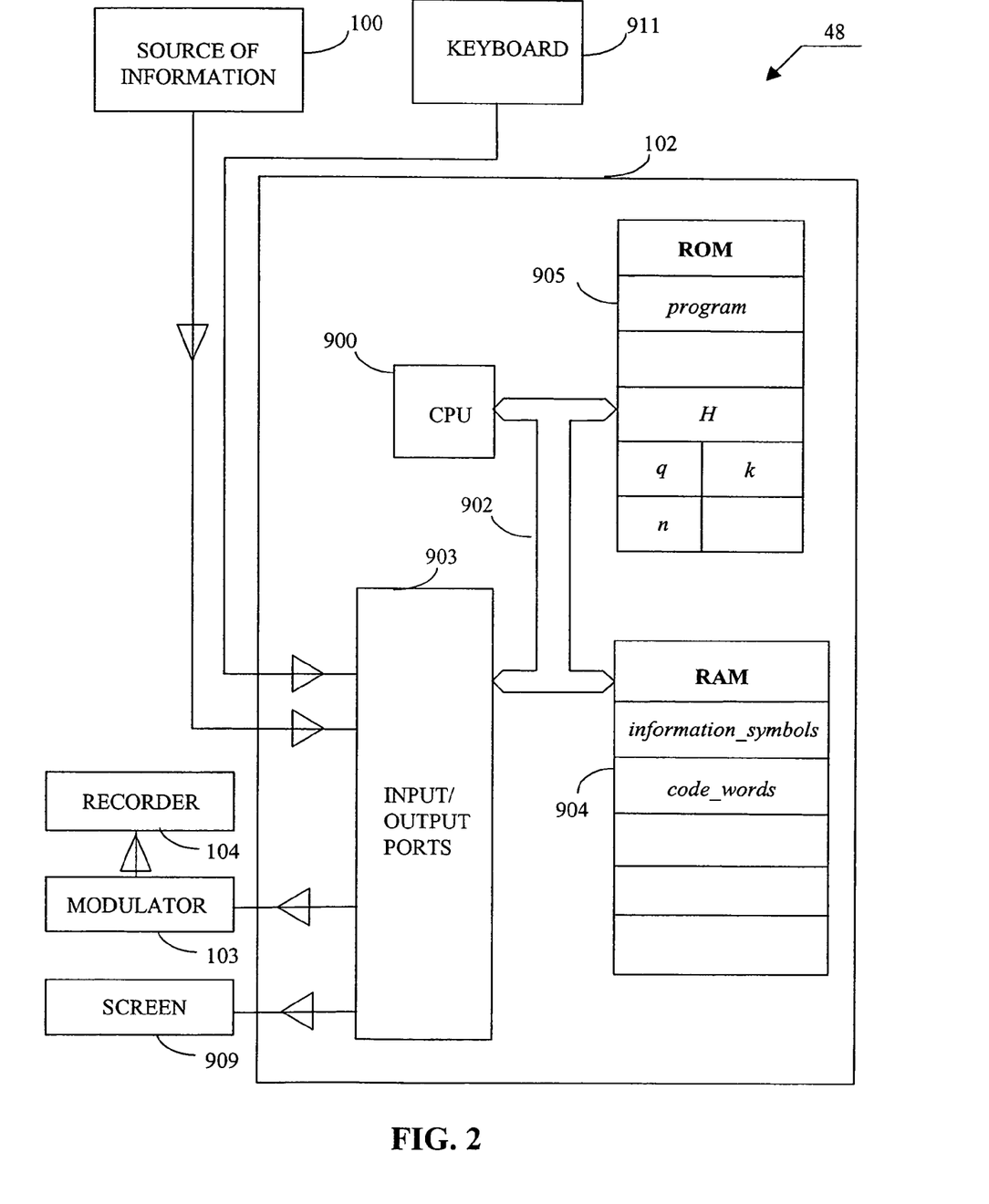
FIG. 2 represents an apparatus for recording digital signals incorporating an encoder according to the invention.

The block diagram of FIG. 2 represents, very schematically, a device 48 for recording data information, the device incorporating an encoder 102.

This device 48 comprises a keyboard 911, a screen 909, a source of external information 100, a modulator 103 and a recorder of modulated data 104, conjointly connected to input/output ports 903 of an encoding device 102 which is implemented here in the form of a logic unit.

The encoding device 102 comprises, connected together by an address and data bus 902:

a central processing unit 900,
a random access memory RAM 904,
a read only memory 905, and
said input/output ports 903.

Each of the elements illustrated in FIG. 2 is well known to a person skilled in the art of microcomputers and transmission systems and, more generally, of information processing systems. These known elements are therefore not described here. It should be noted, however, that:

the information source 100 could, for example, be an interface peripheral, a sensor, a demodulator, an external memory or other information processing system (not shown), and could for example supply sequences of signals representing speech, service messages or multimedia data in particular of IP or ATM type, in the form of sequences of binary data, and the recorder 104 is adapted to record modulated data on a carrier such as a magnetic disk.

The random access memory 904 stores data, variables and intermediate processing results, in memory registers bearing, in the description, the same names as the data whose values they store. It should be noted, in passing, that the word "register" designates, throughout the present description, a memory area of low capacity (a few items of binary data) and equally well a memory area of high capacity (for storing a complete program) within a random access memory or read only memory.

The random access memory 904 contains in particular the following registers:

a register "information_symbols" in which the information symbols belonging to $F_q$ are stored, and a register "code_words", in which the codewords $\underline{v}$ are stored, before being submitted to the transmitter 103.

The read only memory 905 is adapted to store, in registers which, for convenience, have the same names as the data which they store:

the operating program of the central processing unit 900, in a register "program", the length of the codewords in a register "n", the cardinal of the Galois field $F_q$ serving as alphabet for the code used, in a register "q", the number of information symbols serving to construct a codeword, in a register "k", and the parity-check matrix of the code, in a register "H".

Figure 3:
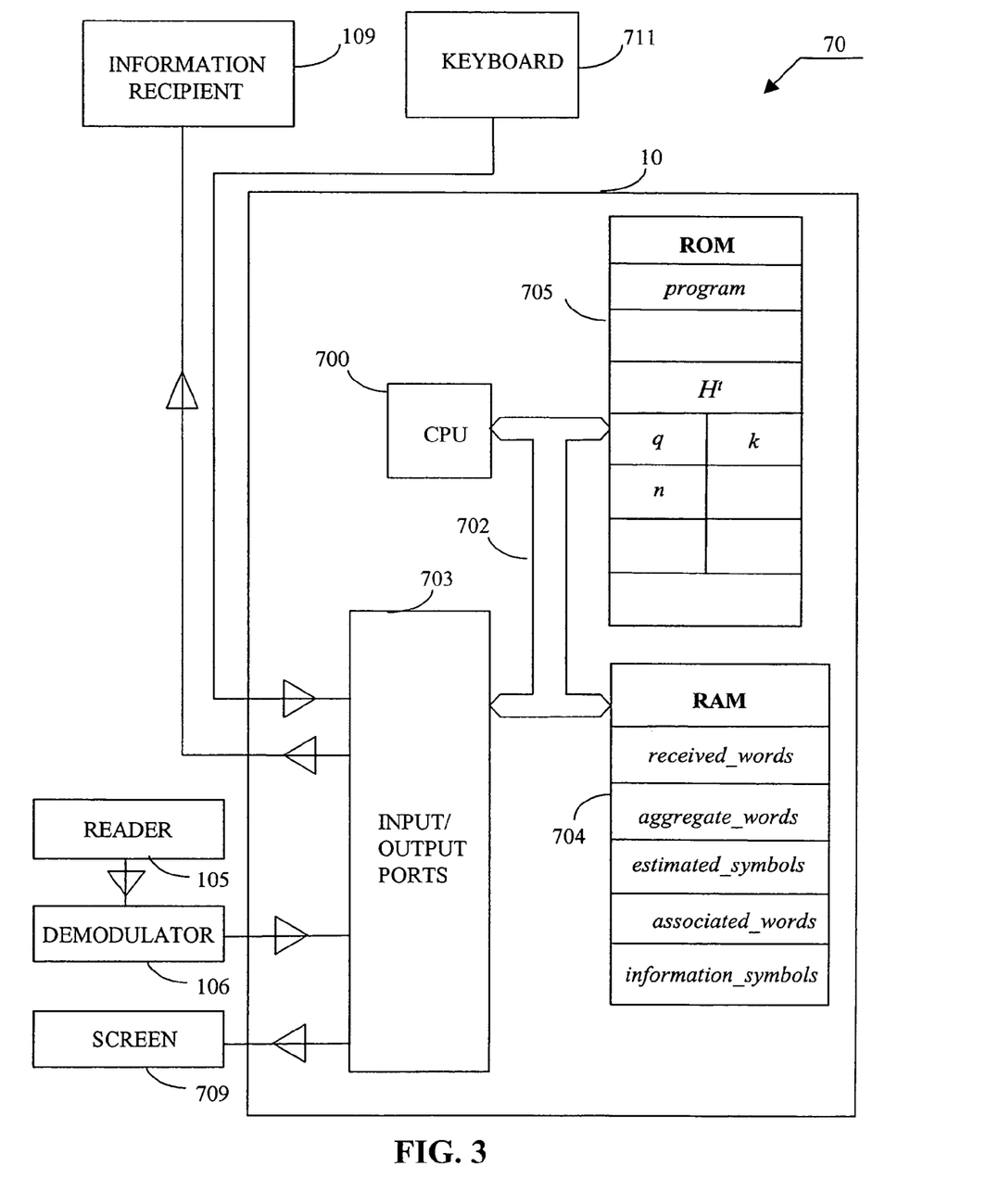
FIG. 3 represents an apparatus for reading digital signals.

The block diagram of FIG. 3 represents an apparatus for reading encoded digital signals 70, incorporating the decoder 10. This apparatus 70 comprises a keyboard 711, a screen 709, a recipient of external information 109, a data reader 105 and a demodulator 106, conjointly connected to input/output ports 703 of the decoder 10 which is produced here in the form of a logic unit.

The decoder 10 comprises, connected together by an address and data bus 702:

a central processing unit 700,
a random access memory (RAM) 704,
read only memory (ROM) 705; and
said input/output ports 703.

Each of the elements illustrated in FIG. 3 is well known to the person skilled in the art of microcomputers and mass storage systems and, more generally, of information processing systems. These known elements are therefore not described here. It should be noted, however, that:

the information recipient 109 could be, for example, an interface peripheral, a display, a modulator, an external memory or other information processing system (not shown), and could be adapted to receive sequences of signals representing speech, service messages or multimedia data in particular of the IP or ATM type, in the form of sequences of binary data, the reader 105 is adapted to read data recorded on a carrier such as a magnetic or magneto-optic disk.

The random access memory 704 stores data, variables and intermediate processing results, in memory registers bearing, in the description, the same names as the data whose values they store. The random access memory 704 contains in particular the following registers:

registers "received_words", in which the received words are kept, registers "aggregate_words", in which the aggregate words are kept, a register "estimated symbols", in which are stored the symbols from a received word in course of correction, a register "associated_words", in which are stored the symbols of the "associated codewords", and a register "information_symbols", in which are stored the symbols resulting from the redundancy removal.

The read only memory 705 is adapted to store, in registers which, for convenience, have the same names as the data which they store:

the operating program of the central processing unit 700, in a register "program", the length of the codewords in a register "n", the cardinal of the Galois field $F_q$ serving as alphabet for the code used, in a register "q", the number of information symbols serving to construct a codeword, in a register "K", and the parity-check matrices of the Reed-Solomon codes, in registers "H'".

It should be noted that, in certain applications, it will be convenient to use the same computer device (functioning in multitask mode) for the exchange, that is to say both the transmission and reception, of signals according to the invention; in this case, the units 10 and 102 will be physically identical.

An application of the invention to the mass storage of data has been described above by way of example, but it is clear that the methods according to the invention may equally well be implemented within a telecommunications network, in which case unit 105 could for example be a receiver adapted to implement a protocol for data packet transmission over a radio channel.

What is claimed is:

1. An encoding method comprising the steps of:
choosing a first algebraic geometric code defined on an algebraic curve represented by an equation of two variables, and each symbol of the first algebraic geometric code belonging to a Galois field;
classifying monomials associated with the first algebraic geometric code into a first plurality of subsets of monomials based on respective orders of one of the two variables;
constituting a second plurality of subsets of monomials by adding at least one monomial to at least one subset of the first plurality of subsets of monomials and removing at least one monomial from at least one subset of the first plurality of subsets of monomials;
defining a locating set for a second algebraic geometric code by choosing separate elements of the number identical to the length of the second algebraic geometric code from a product set of the Galois field;
generating a parity check matrix of the second algebraic geometric code by taking values of the second plurality of subsets of monomials at the locating set for the second algebraic geometric code; and
encoding information symbols into a codeword belonging to the second algebraic geometric code on the basis of the parity check matrix.

2. An encoding method according to claim 1, wherein in said step of constituting the second plurality of subsets of monomials, at least one monomial corresponding to a chosen order of the one of the two variables is added, and at least one monomial corresponding to an order other than the chosen order of the one of the two variables is removed.

3. An encoding device comprising:
choosing means for choosing a first algebraic geometric code defined on an algebraic curve represented by an equation of two variables, and each symbol of the first algebraic geometric code belonging to a Galois field;
classifying means for classifying monomials associated with the first algebraic geometric code into a first plurality of subsets of monomials based on respective orders of one of the two variables;
constituting means for constituting a second plurality of subsets of monomials by adding at least one monomial to at least one subset of the first plurality of subsets of monomials and removing at least one monomial from at least one subset of the first plurality of subsets of monomials;
defining means for defining a locating set for a second algebraic geometric code by choosing separate elements of the number identical to the length of the second algebraic geometric code from a product set of the Galois field;
generating means for generating a parity check matrix of the second algebraic geometric code by taking values of the second plurality of subsets of monomials at the locating set for the second algebraic geometric code; and
encoding means for encoding information symbols into a codeword belonging to the second algebraic geometric code on the basis of the parity check matrix.

4. A computer-readable medium storing a computer program containing instruction codes which, when executed by a computer, perform an encoding method comprising the steps of:
choosing a first algebraic geometric code defined on an algebraic curve represented by an equation of two variables, and each symbol of the first algebraic geometric code belonging to a Galois field;
classifying monomials associated with the first algebraic geometric code into a first plurality of subsets of monomials based on respective orders of one of the two variables;
constituting a second plurality of subsets of monomials by adding at least one monomial to at least one subset of the first plurality of subsets of monomials and removing at least one monomial from at least one subset of the first plurality of subsets of monomials;

defining a locating set for a second algebraic geometric code by choosing separate elements of the number identical to the length of the second algebraic geometric code from a product set of the Galois field;

generating a parity check matrix of the second algebraic geometric code by taking values of the second plurality of subsets of monomials at the locating set for the second algebraic geometric code; and encoding information symbols into a codeword belonging to the second algebraic geometric code on the basis of the parity check matrix.

* * * * *